United States Patent
Micheloni et al.

(10) Patent No.: US 8,990,661 B1
(45) Date of Patent: Mar. 24, 2015

(54) LAYER SPECIFIC ATTENUATION FACTOR LDPC DECODER

(71) Applicant: PMC-Sierra US, Inc., Sunnyvale, CA (US)

(72) Inventors: Rino Micheloni, Turate (IT); Peter Z. Onufryk, Flanders, NJ (US); Alessia Marelli, Dalmine (IT); Christopher I. W. Norrie, San Jose, CA (US)

(73) Assignee: PMC-Sierra US, Inc., Sunnyvale, CA (US)

( * ) Notice: Subject to any disclaimer, the term of this patent is extended or adjusted under 35 U.S.C. 154(b) by 190 days.

(21) Appl. No.: 13/785,848

(22) Filed: Mar. 5, 2013

(51) Int. Cl.
*H03M 13/00* (2006.01)
*H03M 13/13* (2006.01)

(52) U.S. Cl.
CPC ............................ *H03M 13/13* (2013.01)
USPC ............................ 714/774; 714/758

(58) Field of Classification Search
CPC .............. H03M 13/1102; H03M 13/1105; H03M 13/3927
USPC ............................................. 714/774, 758
See application file for complete search history.

(56) References Cited

U.S. PATENT DOCUMENTS

| | | | |
|---|---|---|---|
| 5,732,092 A | 3/1998 | Shinohara | |
| 6,115,788 A | 9/2000 | Thowe | |
| 6,539,515 B1 | 3/2003 | Gong | |
| 6,633,856 B2 * | 10/2003 | Richardson et al. | 706/15 |
| 6,895,547 B2 * | 5/2005 | Eleftheriou et al. | 714/801 |
| 6,934,804 B2 | 8/2005 | Hashemi | |
| 6,976,194 B2 | 12/2005 | Cypher | |
| 6,976,197 B2 | 12/2005 | Faust et al. | |
| 7,206,992 B2 | 4/2007 | Xin | |
| 7,209,527 B2 * | 4/2007 | Smith et al. | 375/341 |
| 7,237,183 B2 | 6/2007 | Xin | |
| 7,484,158 B2 | 1/2009 | Sharon et al. | |
| 7,529,215 B2 | 5/2009 | Osterling | |
| 7,937,641 B2 | 5/2011 | Amidi | |
| 7,958,430 B1 | 6/2011 | Kolokowsky et al. | |
| 7,975,193 B2 | 7/2011 | Johnson | |
| 8,140,930 B1 | 3/2012 | Mauro | |
| 8,176,367 B2 | 5/2012 | Dreifus et al. | |
| 8,219,894 B2 | 7/2012 | Au et al. | |
| 8,245,112 B2 | 8/2012 | Hicken et al. | |
| 8,245,117 B1 | 8/2012 | Wu | |
| 8,255,770 B2 | 8/2012 | Park et al. | |
| 8,261,136 B2 | 9/2012 | D'Abreu et al. | |
| 8,281,217 B2 | 10/2012 | Kim et al. | |
| 8,281,227 B2 | 10/2012 | Thatcher et al. | |
| 8,286,004 B2 | 10/2012 | Williams | |
| 8,307,258 B2 | 11/2012 | Flynn et al. | |
| 8,327,220 B2 | 12/2012 | Borchers et al. | |
| 8,335,977 B2 | 12/2012 | Weingarten et al. | |

(Continued)

*Primary Examiner* — M. Mujtaba K Chaudry
(74) *Attorney, Agent, or Firm* — Kenneth Glass; Molly Sauter; Glass & Associates

(57) ABSTRACT

A low-density parity check (LDPC) decoder is provided for decoding low-density parity check (LDPC) encoded data wherein a layer specific attenuation factor is provided for each layer of the LDPC parity check matrix. An attenuation factor matrix comprising a plurality of coefficients specifies the specific attenuation factor for each layer and each iteration of the decoding process. A check node processor performs check node processing for each layer of the parity check matrix associated with the LDPC encoded codeword utilizing the normalized layered min-sum algorithm wherein the attenuation factor of the min-sum algorithm is determined by the coefficients of the attenuation factor matrix.

20 Claims, 6 Drawing Sheets

(56) References Cited

U.S. PATENT DOCUMENTS

| | | |
|---|---|---|
| 8,359,522 B2 | 1/2013 | Gunnam et al. |
| 8,392,789 B2 | 3/2013 | Biscondi et al. |
| 8,402,201 B2 | 3/2013 | Flynn et al. |
| 8,418,023 B2 | 4/2013 | Gunnam et al. |
| 8,429,497 B2 | 4/2013 | Tu et al. |
| 8,473,812 B2 | 6/2013 | Ramamoorthy et al. |
| 8,504,887 B1 | 8/2013 | Varnica et al. |
| 8,555,140 B2 | 10/2013 | Gunnam et al. |
| 8,621,318 B1 | 12/2013 | Micheloni et al. |
| 8,656,257 B1 | 2/2014 | Micheloni et al. |
| 8,694,849 B1 | 4/2014 | Micheloni et al. |
| 8,694,855 B1 | 4/2014 | Micheloni et al. |
| 8,707,122 B1 | 4/2014 | Micheloni et al. |
| 8,769,374 B2 | 7/2014 | Franceschini et al. |
| 8,787,428 B2 | 7/2014 | Dai et al. |
| 8,856,622 B2 | 10/2014 | Ramamoorthy et al. |
| 2003/0033567 A1 | 2/2003 | Tamura et al. |
| 2003/0104788 A1 | 6/2003 | Kim |
| 2004/0088636 A1 | 5/2004 | Cypher |
| 2004/0123230 A1 | 6/2004 | Lee et al. |
| 2004/0252791 A1 | 12/2004 | Shen et al. |
| 2005/0248999 A1 | 11/2005 | Tamura et al. |
| 2007/0050688 A1 | 3/2007 | Thayer |
| 2007/0089031 A1 | 4/2007 | Huffman et al. |
| 2008/0005382 A1 | 1/2008 | Mimatsu |
| 2008/0016425 A1 | 1/2008 | Khan et al. |
| 2008/0229079 A1 | 9/2008 | Flynn et al. |
| 2008/0229164 A1 | 9/2008 | Tamura et al. |
| 2008/0256292 A1 | 10/2008 | Flynn et al. |
| 2008/0276156 A1 | 11/2008 | Gunnam et al. |
| 2009/0327802 A1 | 12/2009 | Fukutomi |
| 2010/0162075 A1* | 6/2010 | Brannstrom et al. ......... 714/752 |
| 2010/0199149 A1 | 8/2010 | Weingarten |
| 2010/0211737 A1 | 8/2010 | Flynn et al. |
| 2010/0211852 A1 | 8/2010 | Lee et al. |
| 2010/0246664 A1 | 9/2010 | Citta et al. |
| 2010/0293440 A1 | 11/2010 | Thatcher |
| 2011/0072331 A1 | 3/2011 | Sakaue et al. |
| 2011/0246853 A1 | 10/2011 | Kim et al. |
| 2011/0296084 A1 | 12/2011 | Nango |
| 2012/0051144 A1 | 3/2012 | Weingarten et al. |
| 2012/0054413 A1 | 3/2012 | Brandt |
| 2012/0311402 A1 | 12/2012 | Tseng et al. |
| 2013/0013983 A1* | 1/2013 | Livshitz et al. ............... 714/776 |
| 2013/0145235 A1 | 6/2013 | Aussien et al. |
| 2013/0163328 A1 | 6/2013 | Karakulak et al. |
| 2014/0053037 A1* | 2/2014 | Wang et al. ................... 714/752 |
| 2014/0072056 A1 | 3/2014 | Fay |

* cited by examiner

LAYER SPECIFIC ATTENUATION FACTOR LDPC DECODER

BACKGROUND

A solid state drive (SSD) is a data storage device that utilizes solid-state memory to retain data in nonvolatile memory chips. NAND-based flash memories are widely used as the solid-state memory storage in SSDs due to their compactness, low power consumption, low cost, high data throughput and reliability. SSDs commonly employ several NAND-based flash memory chips and a flash controller to manage the flash memory and to transfer data between the flash memory and a host computer.

While NAND-based flash memories are reliable, they are not inherently error-free and often rely on error correction coding (ECC) to correct raw bit errors in the stored data. One commonly employed error correction code employed in nonvolatile memory storage modules, such as SSDs, are low-density parity-check (LDPC) codes. An LDPC code is a linear error correcting code having a parity check matrix with a small number of nonzero elements in each row and column. Various methods for decoding data encoded with LDPC error correction codes are known in the art. One commonly employed decoding method for LDPC coding is the layered min-sum algorithm (MSA). While the min-sum algorithm is an approximation of the quasi-optimal decoding method of belief propagation, the layered min-sum algorithm introduces a further hardware simplification. The layered min-sum algorithm is iterative by layer and is based on belief propagation. The layered min-sum algorithm (MSA) is less complex than other decoding methods known in the art. However, the min-sum algorithm exhibits a noticeable degradation in the decoding performance compared to the more complex decoding methods, such as belief propagation. To counteract the degradation in the decoding performance achievable with the layered min-sum algorithm, normalized layered min-sum algorithms with have been developed incorporating a normalization factor, or attenuation factor, to account for the degradation in decoding performance. However, in the prior art, normalized layered min-sum algorithms utilize the same attenuation factor for each layer of the min-sum decoding process to recover the LDPC encoded codeword. Utilization of the same attenuation factor for each layer of the min-sum decoding algorithm may not converge to the original codeword or may require a high number of iterations for convergence.

Accordingly, what is needed in the art is an improved system and method implementing normalized layered min-sum algorithms for decoding LDPC encoded data.

SUMMARY

In various embodiments, a nonvolatile memory system includes a nonvolatile memory storage module for storing encoded data. The encoded data stored in the nonvolatile memory storage module is encoded using a low-density parity check (LDPC) error correction code. A decoder receives the LDPC encoded data stored in the nonvolatile memory storage module and attempts to decode and recover the data.

A low-density parity check (LDPC) decoder is provided for decoding low-density parity check (LDPC) encoded data wherein a layer specific attenuation factor is provided for each layer of the LDPC parity check matrix. An attenuation factor matrix comprising a plurality of coefficients specifies the specific attenuation factor for each layer, for each iteration, of the decoding process. A check node processor performs check node processing for each layer of the parity check matrix associated with the LDPC encoded codeword utilizing the layered min-sum algorithm wherein the attenuation factor of the min-sum algorithm is determined by the coefficients of the attenuation factor matrix.

In a particular embodiment, a method for decoding low-density parity check (LDPC) encoded data is provided. The method may include, receiving a plurality of log-likelihood ratios (LLRs) at a decoder, each of the plurality of LLRs representing one of a plurality of bits of an LDPC codeword encoded using a parity check matrix having a plurality of layers and decoding the LLRs utilizing a normalized layered min-sum decoding process having at least one layer specific attenuation factor to provide an estimate of the LDPC encoded codeword. The specific attenuation factors may be stored as coefficients within an attenuation factor matrix. The specific attenuation factor may also vary based upon the iteration of the decoding process.

The method of the present invention may include performing check node processing for each layer of the parity check matrix associated with the LDPC encoded codeword utilizing a normalized layered min-sum algorithm having at least one layer specific attenuation factor associated with at least one layer of the parity check matrix, performing variable node processing for each layer of the parity check matrix and performing a check of the estimate of the LDPC encoded codeword to determine if the codeword estimate is a codeword.

An LDPC decoder for decoding low-density parity check (LDPC) encoded data in accordance with the present invention may be used to decode the LDPC encoded data. The encoded data may include a plurality of log-likelihood ratios (LLRs) obtained by reading multiple times a nonvolatile memory storage system, wherein each of the plurality of LLRs represents one of a plurality of bits of an LDPC codeword encoded using a parity check matrix having a plurality of layers. The decoder may include circuitry for decoding the LLRs utilizing a normalized layered min-sum decoding process having at least one layer specific attenuation factor to provide an estimate of the LDPC encoded codeword. The specific attenuation factors may be stored as coefficients within an attenuation factor matrix. The specific attenuation factor may also vary based upon the iteration of the decoding process.

In a specific embodiment, the LDPC decoder may include an attenuation factor matrix comprising a plurality of coefficients, each of the plurality of coefficients identifying a specific attenuation factor for each layer of the plurality of layers of the parity check matrix. The LDPC decoder may further include a check node processor coupled to the attenuation factor matrix, the check node processor having circuitry for performing check node processing for each layer of the parity check matrix associated with the LDPC encoded codeword utilizing a normalized layered min-sum algorithm having at least one layer specific attenuation factor associated with at least one layer of the parity check matrix, a variable node processor coupled to the check node processor, the variable node processor having circuitry for performing variable node processing for each layer of the parity check matrix and a codeword estimate check processor coupled to the variable node processor, the codeword estimate check processor having circuitry for performing a check of the estimate of the LDPC encoded codeword to determine if the codeword estimate is a codeword.

The present invention provides an improved system and method implementing normalized layered min-sum algorithms for decoding LDPC encoded data.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DETAILED DESCRIPTION

Figure 1:
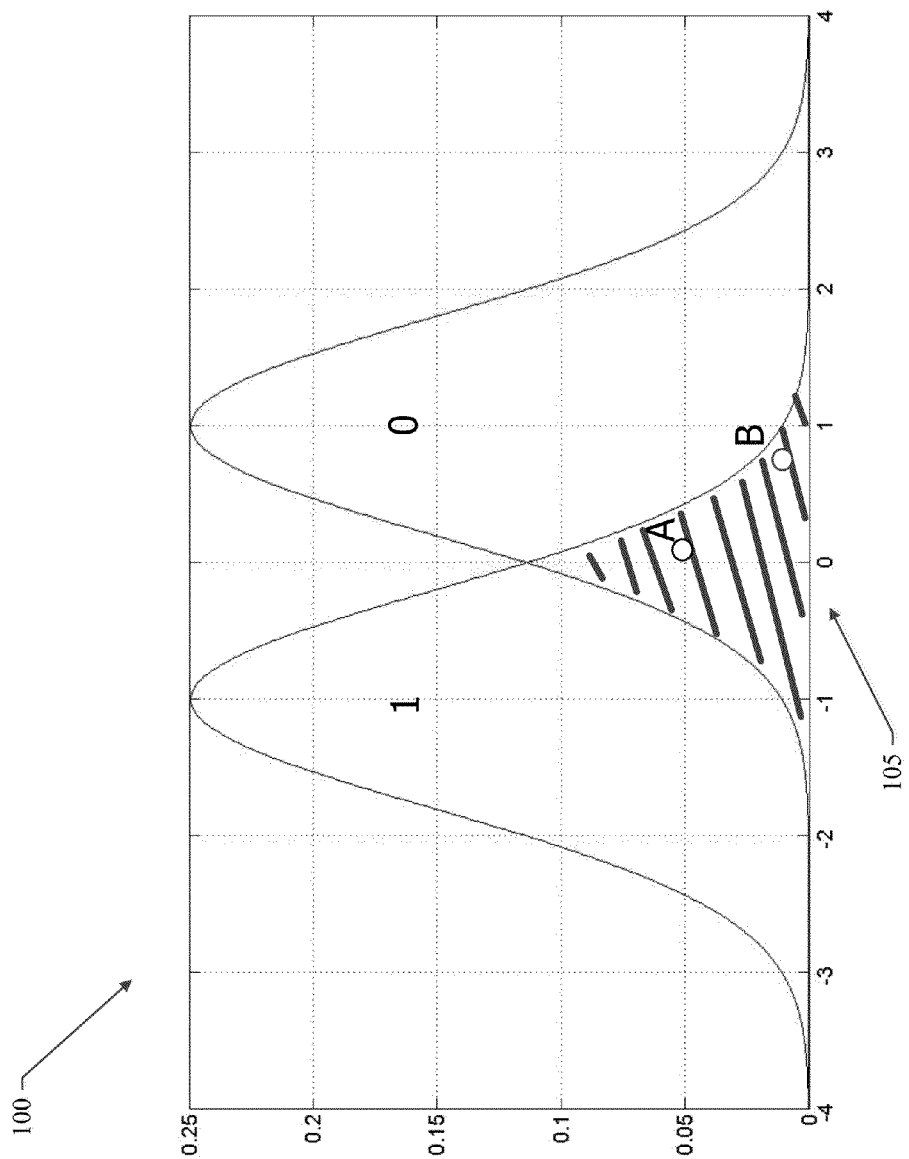
FIG. 1 is graphical illustration of the distribution overlap in the two voltage distributions used for decoding.

In the operation of a stored channel utilizing LDPC encoding, original data are stored in a non-volatile memory. Different noise sources estimated as White Gaussian Noise (AWGN) Channel corrupt the original stored message resulting in a one becoming a zero or vice versa. To improve the bit error rate, BER, the SSD write controller may comprise an LDPC encoder which multiplies an information bit vector with a generator matrix G of the LDPC code. The output of the encoder is then stored in a nonvolatile memory system. During the read operation, the nonvolatile memory system provides the stored codewords to an LDPC decoder which performs the LDPC decoding process.

The nonvolatile memory system used in the communication system may be a NAND-based flash memory system. While NAND-based flash memories are reliable, they are not inherently error-free and often rely on error correction coding (ECC) to correct raw bit errors in the stored data. Various mechanisms may lead to bit errors in flash memories, including noise at the power rails, voltage threshold disturbances during the reading and/or writing of neighboring cells, retention loss due to leakage within the cells and tunneling. Error correction codes (ECC) are commonly employed in flash memories to recover stored data that is affected by such error mechanisms. In operation, ECC supplements the user data with parity bits which store enough extra information for the data to be reconstructed if one or more of the data bits are corrupted. Generally, the number of data bit errors detectable and correctable in the data increases with an increasing number of parity bits in the ECC. In many memory devices, data is stored in a memory location of the memory device along with the ECC for the data. In this way, the data and the ECC may be written to the memory location in a single write memory operation and read from the memory location in a single read memory operation. ECC is typically implemented in the flash memory controller.

NAND flash memories are based on floating gate storage. In floating gate storage technologies, two logic states are achieved by altering the number of electrons within the floating gate. The difference between the two logic states (1 and 0) is on the order of few electrons and is decreasing as the floating gate storage technology advances. The decreasing number of electrons responsible for the difference between the two logic states results in an increased probability of errors in the flash memory cell requiring more error correction. The fraction of data bits that are known to be corrupted, and therefore contain incorrect data, before applying the ECC is referred to as the raw bit error rate (RBER). As a result of the advances in the floating gate storage technology, the RBER for a flash page of memory cells is increasing and at technologies with feature sizes in the 1× range (below 20 nm) is nearing the Shannon Limit of the communication channel. The increased probability of errors in the stored data results in an increase in the error code correction necessary to correct the bit errors in the flash memory. The error rate observed after application of the ECC is referred to as the uncorrectable bit error rate (UBER). The acceptable UBER is often dependent upon the application in which the SSD is employed. In the case of price sensitive, consumer applications, which experience a relatively low number of memory accesses during the SSD product lifetime, the SSD may tolerate a higher UBER as compared to a high-end application experiencing a relatively high number of memory accesses, such as an Enterprise application.

To achieve an acceptable UBER for Enterprise applications employed in a flash storage controller, low-density parity-check (LDPC) error correction coding is commonly used. An LDPC code is a linear error correcting code having a parity check matrix with a small number of nonzero elements in each row and column. LDPC codes are capacity-approaching codes that allow the noise threshold to be set very close to the Shannon limit for a symmetric, memory-less channel. The noise threshold defines an upper bound for the channel noise, up to which the probability of lost information can be made as small as desired.

The power of LDPC codes resides in the ability of the decoding strategy to exploit the soft information on the stored data. In LDPC decoding, the two voltage distributions represent the two possible states: "0" and "1", of the cells within the NAND chips. When the voltage distributions overlap 105, as shown with reference to the graph 100 of FIG. 1, errors arise. A hard decision decoder will read all the positive values as 0 and all the negative values as 1. So, in the situation depicted in the graph 100, the overlap region 105 will be composed of read errors. However, observing error points A and B within the overlap region 105, it is clear that the error points may vary in magnitude. For example, point A is slightly positive, while point B is farther away from zero. As such, point B is considered to be much more in error than point A. By exploiting the exact value of point A and point B, differentiation can be used between the two points and better information can then be provided to the decoder, resulting in improved decoding performance of the decoder in decoding the LDPC encoded codewords. Estimations of the exact value of point A and point B are referred to as soft information, which may be expressed by a log likelihood ratio (LLR). The read errors are not binary in nature, but instead vary from an ideal voltage according to an analog function. LDPC decoders have the ability to address this non-binary behavior using LLRs. The LLR attributed to a bit is representative of the probability that the voltage value read corresponds to a 0 or a 1. In the case of a NAND chip exhibiting a low noise case, a corresponding low raw bit error rate (RBER) will exist wherein most LLRs will have a large magnitude, while only a few LLRs will have a small magnitude.

LDPC decoding is performed based upon a parity check matrix which consists of "0"'s and "1"'s that define the parity check equations. An M×N parity check matrix (H) comprises M rows and N columns. The number of columns N corresponds to the number N of codeword bits within one encoded codeword and the codeword comprises a plurality of information bits (K) and M parity check bits. The number of rows within the parity check matrix corresponds to the number M of parity check bits in the codeword.

The decoding of the LDPC codes is an iterative process that uses as input, the LLR of the received data bits in the codeword, as in the equation:

$$LLR(x) = \log\left[\frac{p(x \mid y = 0)}{p(x \mid y = 1)}\right]$$

where "x" is the read message and "y" is the original codeword. When performing decoding of the codeword, the LLRs are propagated and updated between the variable nodes and the check nodes in a Tanner graph which is representative of the parity check matrix of the LDPC code.

With reference to FIG. 2, it is useful to think of the parity check matrix used for LDPC decoding in terms of its equivalent Tanner graph. A Tanner graph is a bipartite graph used to state constraints or equations which specify error correcting codes. In a Tanner graph representative of the parity check matrix, there are M=N–K check nodes C, one check node for each check equation, and N variable nodes, one variable node for each codeword bit. During the decoding process, the M check nodes and N variable nodes iteratively exchange information between themselves according to the LDPC decoding algorithm. The "1"'s in the parity check matrix determine the connections between the check nodes and the variable nodes. Iterative information exchange is performed only between the check nodes and the variable nodes that are connected to each other as defined in the parity check matrix.

Figure 2B:
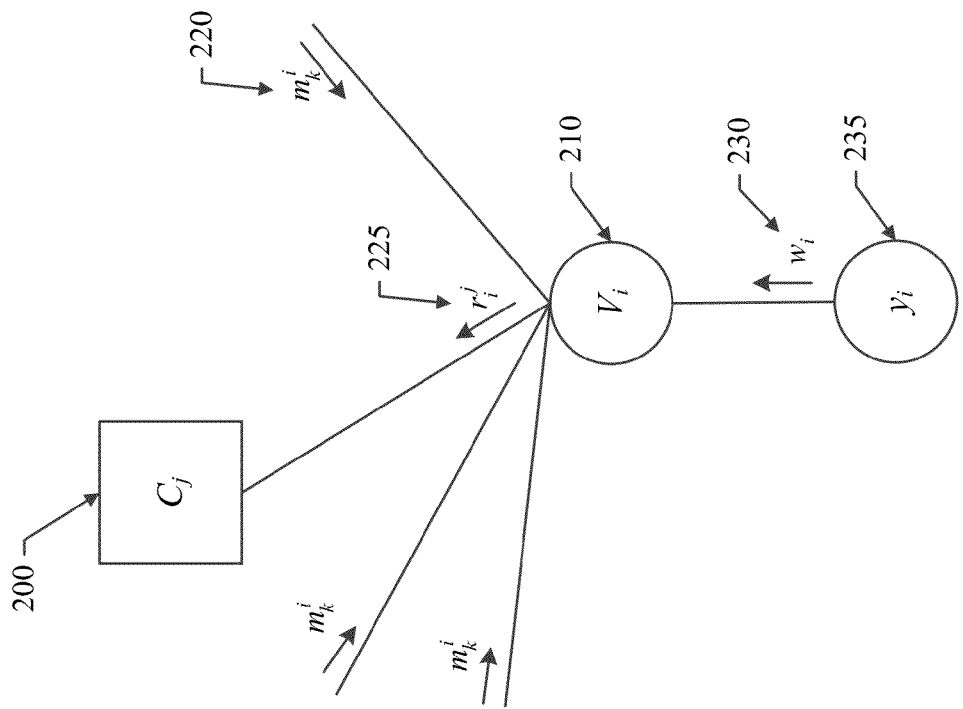
FIG. 2B is a diagram illustrating variable node processing within an LDPC parity check matrix.
Figure 2A:
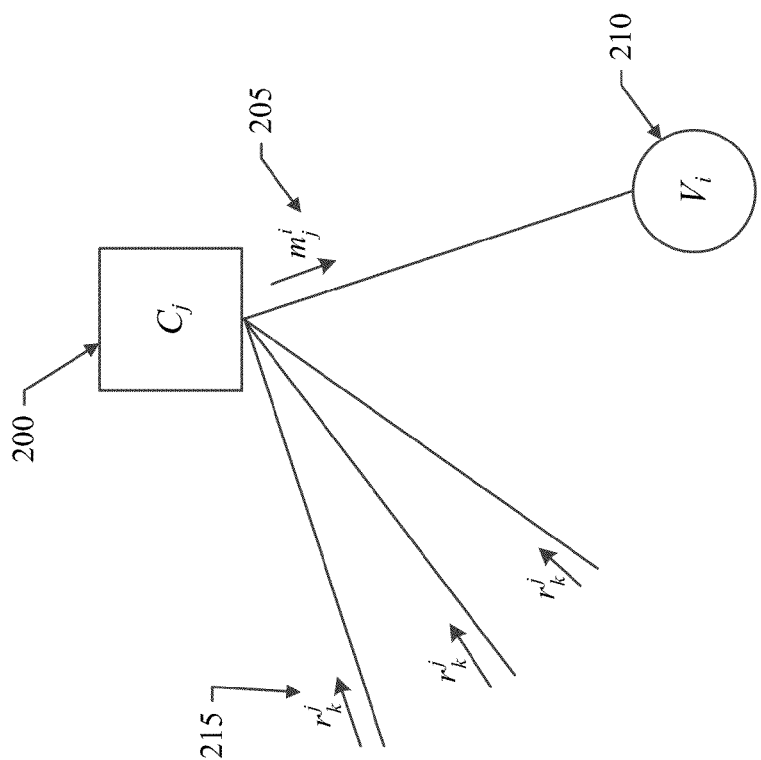
FIG. 2A is a diagram illustrating check node processing within an LDPC parity check matrix.

In the check node processing phase of the decoding as illustrated in FIG. 2A, each check node ($C_j$) 200 computes values ($m_j^i$) 205 to be sent to the variable nodes ($V_i$) 210 to which the check node 200 is connected as defined by the parity check matrix. Each time the check node 200 computes the value 205, only extrinsic information is taken into account. In other words, the value $m_i$ is computed using all the values sent by the variable nodes connected to that check node $r_k^j$ 215, except variable node i, according to the following formulas:

$$m_j^i = \prod_{k \in N(j)\setminus\{i\}} \text{sign}(r_k^j) \cdot \phi\left(\sum_{k \in N(j)\setminus\{i\}} \phi(|r_k^j|)\right)$$

$$\phi(x) = -\log\left(\tanh\left(\frac{x}{2}\right)\right)$$

A similar concept is applied to variable node processing in accordance with the parity check matrix as shown with reference to FIG. 2B. In variable node processing, the value $r_j$ 225, representing the codeword estimate, is computed using all the values $m_k^i$ 220 sent by the check nodes connected to the variable node 210, except check node j 200 and the input LLRs 230 read from the NAND cells 235, according to the following formula:

$$r_j^i = w_i + \sum_{k \in N(i)\setminus\{j\}} m_k^i$$

Following every iteration of the check node processing and variable node processing steps, the resulting codeword estimate (r) is checked to verify that it is a codeword by multiplying it by the transpose of the parity check matrix (H). If the result is null, then r is a considered a codeword and the decoding is complete. If the result is not null, then the decoding is not considered complete and a new iteration is started.

The message passing computation rule procedure as described above is referred to as a belief propagation (BP) computation rule and is also commonly known as the sum-product algorithm (SPA). While the sum-product algorithm is known to achieve the best decoding performance, it is computationally complex. The formula used in check node processing following the sum-product algorithm is a very complex formula involving both the tan h and the log function which are difficult to implement in hardware necessary to compute the check node formula. The computational complexity of the SPA necessitates a decoding device having a large number of logic gates, resulting in an increased cost and decreased power efficiency of the device.

In the sum-product algorithm, the $\phi$ function produces a very large result for small values of x (read messages) and a very small result for large values of x (read messages). In general, as x approaches zero, $\phi(x)$ approaches infinity and as x increases from zero, $\phi(x)$ rapidly decreases in value.

When a check node receives the extrinsic information it operates on, the majority of the information will have originated from reasonably reliable sources, because most of the variable nodes associated with the check node will have large LLR magnitudes, representing a high probability that the message read from the memory is the original codeword that was stored. When only a small amount of noise has affected the stored bits, and as such the raw bit error rate (RBER) is low, the majority of LLRs will tend to have a large magnitude, while only a few LLRs will have a small magnitude. For example, at a raw bit error rate (RBER) of 1e-3, an average of only 1 in 1000 bits is in error. As such, all the extrinsic information operated on by the check nodes will have large LLR magnitudes except for the check nodes that process bits that are in error. However, even in the case where the check node is processing bits that are in error, it is likely that only 1 of the extrinsic sources for that particular check node has a small LLR magnitude. The small LLR magnitude of that one extrinsic source will have the greatest effect on the $\phi$ function, as previously discussed. As a result of the complexity of the sum-product algorithm, and the assumption that the smallest extrinsic value approximates all extrinsic values received by a check node, approximated decoders utilizing a min-sum algorithm (MSA) have been developed where the $\phi$ function is computed as a minimum among the magnitudes of a set of values according to the formula:

$$m_j^i = \prod_{k \in N(j)\setminus\{i\}} \text{sign}(r_k^j) \cdot \min_{k \in N(j)\setminus\{i\}} |r_k^j|$$

However, since utilizing this formula yields an approximation to the full sum-product algorithm (SPA), an attenuation, or normalization, factor ($\alpha$) is introduced into the MSA computation as:

$$m_j^i = \alpha \cdot \prod_{k \in N(j)\setminus\{i\}} \text{sign}(r_k^j) \cdot \min_{k \in N(j)\setminus\{i\}} |r_k^j|$$

In the normalized min-sum algorithm, the complicated computation of the tan h function and the log function are replaced with a simple minimum value finding operation at the cost of decoding performance. The loss of decoding performance is then recovered by applying a normalizing factor or attenuation factor to the check node processing outputs to improve the error performance.

For example, assuming a typical low noise situation wherein one small magnitude LLR and three larger magnitude LLRs are received as a series of four extrinsics as 0.1, 3, 3 and 3. The associated $\phi(x)$ for these received extrinsics would be 3.00, 0.01, 0.01 and 0.01, respectively, then the sum of the $\phi$ values for these extrinsics would be equal to 3.03 and the $\phi$ of the sum would be equal to about 0.1. The min-sum estimate would also result in a value of 0.1 by ignoring the last three LLRs (3, 3, 3) and considering only the first LLR (0.1). As such, in a low noise situation the assumption can be made that the smallest extrinsic value approximates all extrinsic values received by a check node and the min-sum algorithm will provide a close approximation without requiring any additional attenuation. In general, very little attenuation is required in a low noise situation.

In contrast, in a higher noise situation wherein a series of four received extrinsics are 0.1, 1, 1 and 1, the sum of the $\phi$ of the received extrinsics is 3+(3*0.77)=5.3 and $\phi(5.3)$ is equal to 0.01, the output of the check node processing utilizing SPA would be 0.01. However, utilizing the min-sum approximation, the output of the check node processing would be equal to 0.1, which is not a close approximation to the SPA result. As such, in a higher noise situation, the min-sum result will require greater attenuation to more closely approximate the SPA result. In general, attenuating the min-sum result when there is more noise tends to increase the accuracy of the approximation towards the correct check node result.

While in the case of low RBER the min-sum approximation closely approximates the sum-product algorithm (SPA), in the case of high RBER, the approximation may not resemble the sum-product algorithm because the assumption that only 1 extrinsic is small may not be accurate. As such, in the case of high RBER, the min-sum check node calculation may be a poor approximation to the real $\phi$ function result of the sum-product algorithm (SPA). In the case of high RBER, the full min-sum check node calculation will generate a result that is noticeably larger than the sum of $\phi$ result of the sum-product algorithm, which translates to a higher than optimal estimate of the likelihood of which bits are in error versus which are not in error. As such, at high RBER the min-sum calculation tends to be overly optimistic when compared to the sum-product calculation.

The error performance of the LDPC decoder can be further improved by using an iterative layered decoding technique which achieves a faster decoding convergence due to the optimized scheduling of the messages.

In non-layered scheduling for min-sum LDPC decoding, all of the check node processing is performed prior to initiating the variable node processing. Alternatively, in layered scheduling for min-sum LDPC decoding, the iterative decoding process of the normalized min-sum layered algorithm is performed layer by layer. With layered LDPC decoding, the parity-check matrix may be viewed as group of horizontal layers, each horizontal layer representing the check nodes for one layer. In layered scheduling, once the processing has been completed for all the check nodes of a first layer, the processing may immediately switch to the variable node processing. In this way, the computations for the check nodes of the second layer utilizes an input that is more likely to have larger LLRs as compared to the initial values utilized in the computations of the first layer. As such, in layered min-sum LDPC decoding, after the check nodes complete the min-sum algorithm for the variable nodes they are connected to in the first layer, these variable nodes are updated and the check nodes utilize these updated messages to complete the min-sum algorithm for the second layer. However, in standard normalized layered min-sum LDPC decoding, the attenuation factor is not subject to change during the decoding procedure and the attenuation factor remains the same, regardless of the layer of the structure upon which the min-sum calculation is being performed. Utilizing the same attenuation factor for all the layers during the decoding procedure may not yield the best decoding performance, because the calculations for the second layer already utilizes an input which is cleaner than the first layer and as such, may require an attenuation factor that is different than the first layer.

In the standard normalized min-sum algorithm, the attenuation factor is computed by comparing the value obtained with the belief propagation algorithm and the min-sum algorithm. In other words, the attenuation factor is computed as the ratio of the average value in check node processing computed with belief propagation and the average value in check node processing computed with the min-sum algorithm.

In the normalized layered min-sum algorithm of the present invention, the layered concept is applied to belief propagation to create a layered belief propagation decoding method. Once this method has been created, a unique attenuation factor layer per layer is computed as the ratio between the average value in check node processing belonging to each layer computed with the layered belief propagation decoding method and the average value in check node processing belonging to each layer computed with the layered min-sum algorithm decoding method. The present invention recognizes that the in normalized layered min-sum LDPC decoding, the first time a variable node is updated, i.e. first layer, is the most significant step toward a converging result. As such, the min-sum calculation for the first layer will therefore tend to have more small-valued extrinsics at the check nodes than the min-sum calculation for the second layer. Due to the larger number of small-valued extrinsics present in the min-sum calculation for the first layer, the final $\phi$ result for the min-sum calculation for the first layer will tend to be larger than the sum-product algorithm would have calculated utilizing the real $\phi$ function. Therefore, the first layer in the layered min-sum LDPC decoding should be attenuated more than the following layers. As follows, the min-sum calculation for the second layer will tend to have fewer small-valued extrinsics because the largest step to convergence was already taken in the first layer. As such, the final $\phi$ result of the second layer will tend to be closer to the real $\phi$ result of the sum-product algorithm and therefore, should be attenuated to a lesser degree. In general the attenuation factor of the layer is most critical when the convergence is taking the largest steps towards convergence, i.e. when the number of small-valued extrinsics is large. As the number of small-valued extrinsics decreases through the processing of the layers, the attenuation factor should be reduced to more closely approximate the real $\phi$ function of the sum-product algorithm.

To increase the decoding performance of the LDPC decoder, the unique attenuation factor per layer is used to correctly approximate the check node computation at each layer. Utilizing the layer specific attenuation factor, the decoding performance of a standard normalized min-sum LDPC decoder can be improved. In a particular embodiment, the layer specific attenuation factors are calculated during the design process of the decoder. The layer specific attenuation factors are stored in a lookup table or matrix. During the design process, various lookup tables are populated with layer specific attenuation factors based upon a specific bit error rate (BER). In operation, during the LDPC decoding process, the bit error rate (BER) is estimated and a pointer points to the appropriate lookup table or matrix based upon the estimated BER. The layer specific attenuation factor in accordance with the present invention may be implemented utilizing an attenuation factor matrix as illustrated with reference to FIG. 3.

Figures 3A, 3B:
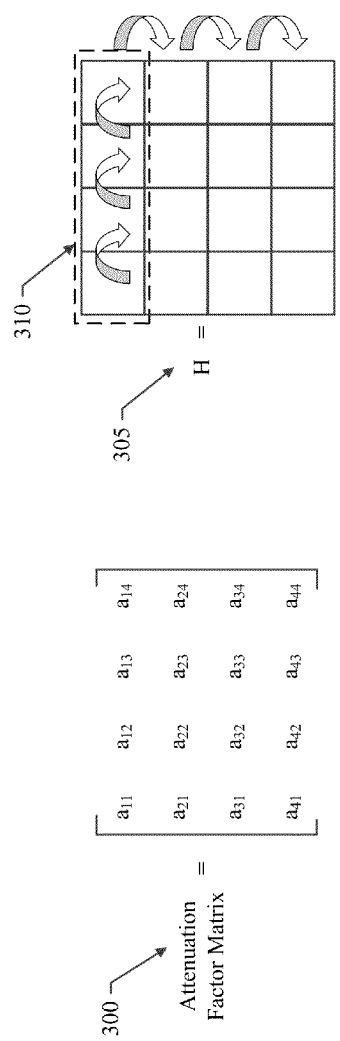
FIG. 3A is an illustration of the attenuation factor matrix in accordance with the present invention.
FIG. 3B is an illustration of the message passing between the rows and column of the parity check matrix.

In the exemplary embodiment illustrated in FIG. 3B, a parity check matrix (H) 305 may comprise 4 layers, wherein a layer 310 may be equivalent to one circulant row for a quasi-cyclic LDPC code having a circulant row weight equal to "1", meaning that only one "1" appears in any row or any column of the matrix (H). In another embodiment, when the weight of a circulant row is greater than "1", a layer may be smaller than a circulant row. As such, it is within the scope of the present invention that there may be multiple layers in a circulant row of the matrix (H) if the weight of the circulant row is greater than "1". In general, a layer may be considered the largest number of rows of the matrix (H) that never connects a variable node to multiple check nodes. In the present invention, a layer is the ideal granularity, offering the most precise level of attenuation control. As such, any attenuation control at a granularity less than a layer does not result in any mathematical advantage.

In the embodiment illustrated in FIG. 3B, an attenuation factor matrix 300 of FIG. 3A may be used to establish an attenuation factor for each layer 310. The attenuation factors may be dependent upon the iteration count and if a codeword requires more than 4 iterations to achieve decoding, the attenuation factor of the fourth iteration may be used. As illustrated by the attenuation factor matrix 300, a coefficient $a_{ij}$ is identified for every iteration and every layer, where i is the iteration number of the decoding process and j is the layer number in the decoding process. Utilizing a specific attenuation factor per layer allows for correctly approximating the check node computation for each layer and results in improved decoder performance. The layer specific attenuation factor may be a small positive number determined by density evolution. In a particular embodiment, the attenuation factor for each layer may be determined by comparing the layered min-sum algorithm for the layer with a layered belief-propagation algorithm. The average ratio between the results of these two algorithms may be the attenuation factor for that particular layer.

The attenuation factor matrix of the present invention may be used to improve the performance of the LDPC decoder in decoding LDPC encoded data that is stored in a nonvolatile memory system. As shown with reference to FIG. 4, a nonvolatile memory system 400, such as a solid state drive, may include a nonvolatile storage module 415 and a nonvolatile memory controller 405. The nonvolatile memory storage module 415 may comprise a plurality of NAND chips 430. Each of the plurality of NAND chips 430 may be coupled to the nonvolatile memory controller 405 through a plurality of channels 420. In this embodiment, the NAND chips 430 store the encoded codewords and the memory controller 405 is designed to execute reading and writing controls for the NAND chips 430 according to reading and writing instructions received from an access device.

Figure 4:
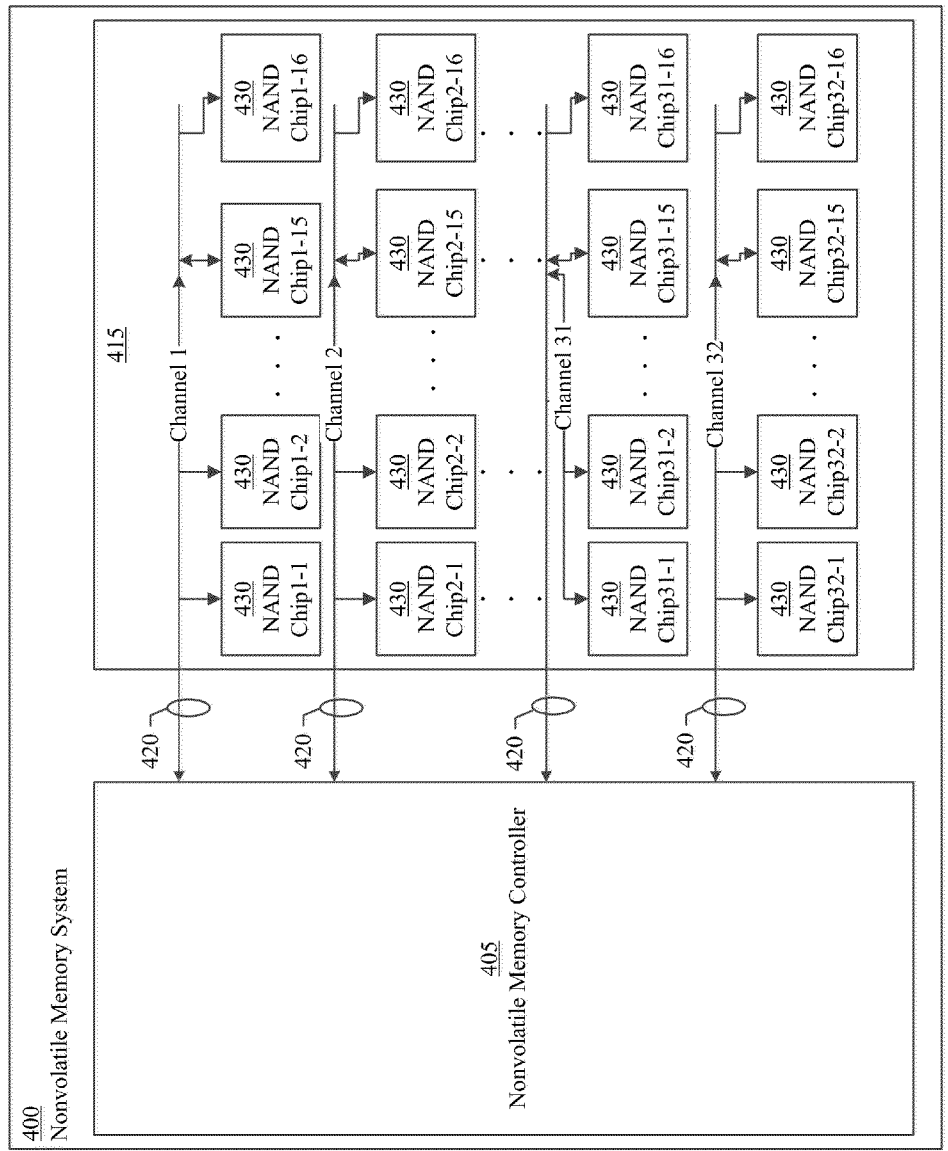
FIG. 4 is a block diagram illustrating a nonvolatile memory system.
Figure 5:
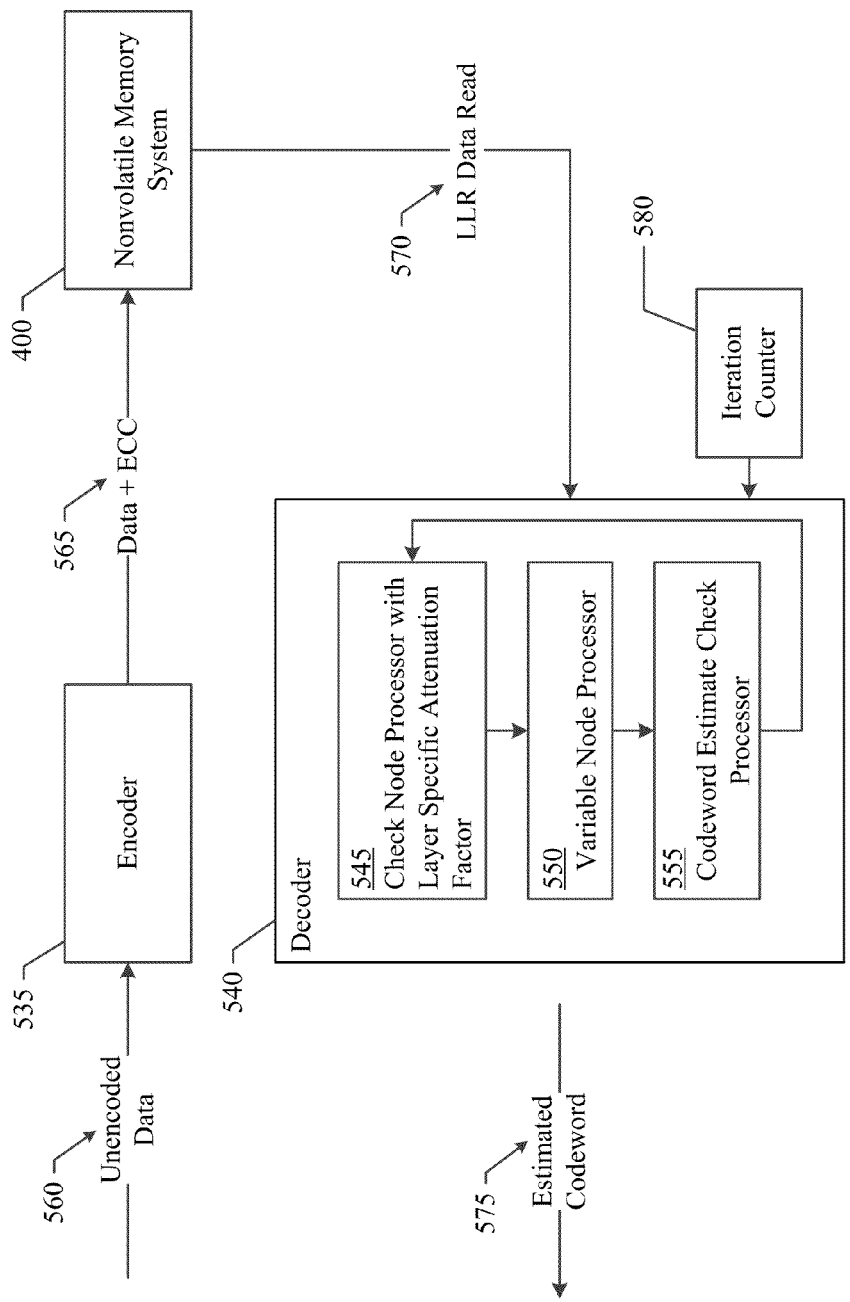
FIG. 5 is a block diagram illustrating LDPC encoding and LDPC decoding in accordance with an embodiment of the present invention.

The nonvolatile memory system 400 of FIG. 4 may be incorporated into a LDPC system as shown with reference to FIG. 5. As shown, the LDPC system may comprise an encoder 535 that is responsible for adding the parity bits to the user data 560 in accordance with a low-density parity check (LDPC) code. The LDPC encoded data 565, which includes the user data 560 and an error correction code, may then be stored as encoded codewords in the nonvolatile memory system 400. In a particular embodiment the nonvolatile memory system 400 may include a plurality of NAND chips 430 and a nonvolatile memory controller 405 as previously described with reference to FIG. 4.

In the present invention, LDPC decoding of the codeword is performed based upon the parity check matrix and an attenuation factor matrix. The parity check matrix consists of "0"s and "1"s defining the parity check equations. For an "M" row×"N" column parity check matrix, M check nodes and N variable nodes iteratively exchange messages between each other according to the LDPC decoding algorithm. The "1"s in the parity check matrix define the connections between the variable nodes and the check nodes and the exchange of information is performed only between the nodes connected to each other as defined by the parity check matrix. The present invention employs a layered decoding technique in which message updates are performed after the completion of each layer of the parity check matrix. A layer may be defined as a single row of the parity check matrix, or as a group of rows of the parity check matrix. The values of the attenuation factor matrix define an attenuation factor to be used for the check node processing for each layer, and for each iteration, during the decoding process. The layer specific attenuation factor may be different for each layer or the layer specific attenuation factor may be different for only one layer of the parity check matrix.

In operation of the present invention, during a read operation of the nonvolatile memory system 400, multiple reads of the stored codewords are executed to provide soft information represented by LLRs 570 as previously described. The LLRs 570 are used as input to the LDPC decoder 540 to decode the user message data 560 and encoded by, the encoder 535, utilizing LDPC coding following a parity check matrix (H). The received LLR values for each variable node are taken as the initial variable node messages. The check node processor 545 updates the check nodes of a first layer with the variable node messages they are connected to, using the normalized layered min-sum algorithm modified by the layer specific attenuation factor from the attenuation matrix for the first layer and the first iteration. The resulting messages of the check node processor 545 are then passed to the variable node processor 550 and the variable node processor 550 then updates each variable node with the check node messages to which they are connected. The decoding process continues at the second layer, using the normalized layered min-sum algorithm modified by the layer specific attenuation factor from the attenuation factor matrix for the second layer and the first iteration. The decoding process continues in this way, utilizing the layer specific attenuation factor from the attenuation factor matrix for each of the layers, resulting in a codeword estimate. The codeword estimate is checked by a codeword estimate check processor 555, to verify whether or not the codeword estimate is a codeword. In a particular embodiment, the codeword estimate may be multiplied by the parity check matrix to determine the syndrome and if the syndrome is zero, it may be determined that the codeword estimate is a codeword. If the codeword estimate is a codeword, the decoding is complete and the estimated codeword is provided as output 575 from the decoder 540. If it is determined by the codeword estimate check processor 555 that the codeword estimate is not a codeword, a second iteration of the decoding begins. In the second iteration, the attenuation factors from the attenuation factor matrix for the second iteration for each of the layers are used. The iteration counter 580 may be used to track the number of iterations of the decoding process and may cause the decoding to terminate if a maximum number of iterations is reached.

Figure 6:
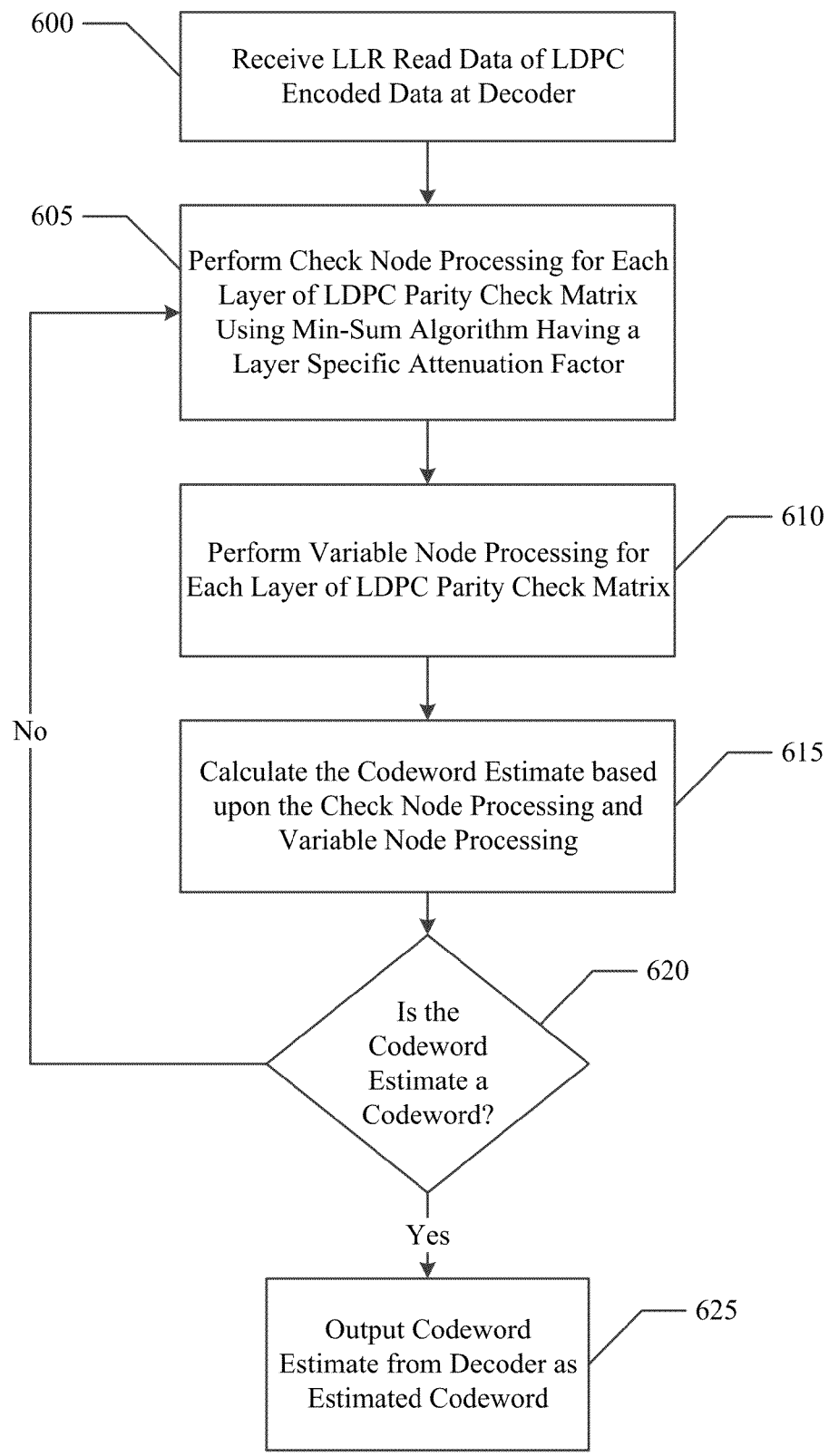
FIG. 6 is a flow diagram illustrating the decoding method in accordance with the present invention.

With reference to FIG. 6, in a particular embodiment of the present invention, LLR read data of the LDPC encoded data may be received at an LDPC decoder 600. In a particular embodiment, the LLRs may be read from a nonvolatile memory storage, such as a solid state drive (SSD) comprising a plurality of NAND chips. As previously described, iterative decoding is performed using the LLRs of the LDPC codeword. In iterative decoding, the check node processor 545 of the decoder 540 performs check node processing for each layer of the LDPC parity check matrix using a layered min-sum algorithm having a layer specific attenuation factor 605. In the present invention, the adjustment to the min-sum algorithm result may be different for each layer of the parity check matrix depending upon the layer specific attenuation factor. The layer specific attenuation factor may also be different for each iteration of the decoding process. The messages resulting from the check node processing are passed to the variable node processor and the variable node processor 550 of the decoder 540 then performs variable node processing for each layer 610 and produces a codeword estimate based upon the check node processing and variable node processing 615. The codeword estimate check processor 555 of the decoder 540 then checks to verify that the codeword estimate is a codeword 620. If the codeword estimate is determined to be a codeword, the codeword estimate is transmitted from the decoder as an estimated codeword 625. However, if the codeword estimate is not determined to be a codeword, a next iteration of the decoding process is initiated beginning with the check node processing step 605.

In various embodiments, the system of the present invention may be implemented in a Field Programmable Gate Array (FPGA) or Application Specific Integrated Circuit (ASIC) suitable for the design of encoders/decoders for LDPC codes.

Although the invention has been described with reference to particular embodiments thereof, it will be apparent to one of ordinary skill in the art that modifications to the described embodiment may be made without departing from the spirit of the invention. Accordingly, the scope of the invention will be defined by the attached claims not by the above detailed description.

What is claimed is:

1. An LDPC decoder for decoding low-density parity check (LDPC) encoded data, the LDPC encoded data comprising a plurality of log-likelihood ratios (LLRs), each of the plurality of LLRs representing one of a plurality of bits of an LDPC codeword encoded using a parity check matrix having a plurality of layers, the decoder comprising:
   an attenuation factor matrix comprising a plurality of coefficients, each of the plurality of coefficients identifying a layer specific attenuation factor for each layer of the plurality of layers of the parity check matrix;
   a check node processor coupled to the attenuation factor matrix, the check node processor having circuitry for performing check node processing for each layer of the parity check matrix associated with the LDPC encoded codeword utilizing a layered min-sum algorithm having at least one layer specific attenuation factor associated with at least one layer of the parity check matrix;
   a variable node processor coupled to the check node processor, the variable node processor having circuitry for performing variable node processing for each layer of the parity check matrix; and
   a codeword estimate check processor coupled to the variable node processor, the codeword estimate check processor having circuitry for performing a check of the estimate of the LDPC encoded codeword to determine if the codeword estimate is a codeword.

2. The LDPC decoder of claim 1, wherein the plurality of coefficients are stored in a lookup table.

3. The LDPC decoder of claim 2, wherein the decoding may be performed over multiple iterations and wherein the layer specific attenuation factor matrix includes coefficients for a first iteration and a second iteration, at least some of the coefficients for the first iteration different from the coefficients for the second iteration.

4. A method for decoding low-density parity check (LDPC) encoded data, the method comprising:
   receiving a plurality of log-likelihood ratios (LLRs) at a decoder, each of the plurality of LLRs representing one of a plurality of bits of an LDPC codeword encoded using a parity check matrix having a plurality of layers;
   decoding the LLRs utilizing an attenuation factor matrix and a normalized layered min-sum decoding process to provide an estimate of the LDPC encoded codeword, the attenuation factor matrix including coefficients identifying attenuation factors for two or more of the layers of the parity check matrix.

5. The method of claim 4, wherein the attenuation factor matrix includes a coefficient for each of the layers of the parity check matrix.

6. The method of claim 4, wherein the layers of the parity check matrix include a first layer and a second layer, the coefficient for the first layer different from the coefficient for the second layer.

7. The method of claim 6, wherein the decoding may be performed over multiple iterations and wherein the attenuation factor matrix includes coefficients for a first iteration and a second iteration, at least some of the coefficients for the first iteration different from the coefficients for the second iteration.

8. The method of claim 6 wherein the attenuation factor matrix includes coefficients for each iteration of the decoding process.

9. The method of claim 6 wherein the attenuation factor matrix includes a coefficient for each layer of the parity check matrix and each iteration of the decoding process.

10. The method of claim 4, wherein decoding the LLRs further comprises:
    performing check node processing for each layer of the parity check matrix associated with the LDPC encoded codeword utilizing a normalized layered min-sum algorithm having at least one layer specific attenuation factor associated with at least one layer of the parity check matrix;
    performing variable node processing for each layer of the parity check matrix; and
    performing a check of the estimate of the LDPC encoded codeword to determine if the codeword estimate is a codeword.

11. The method of claim 10, further comprising, after performing a check of the estimate of the LDPC encoded codeword to determine if the codeword estimate is a codeword:
    if the codeword estimate is a codeword, outputting the codeword estimate from the decoder; and
    if the codeword estimate is not a codeword, initiating another iteration of the decoding process beginning with performing check node processing.

12. The method of claim 11, where each layer is identified as one or more circulant rows in the parity check matrix associated with the LDPC encoded codeword.

13. An LDPC decoder for decoding low-density parity check (LDPC) encoded data, the LDPC encoded data comprising a plurality of log-likelihood ratios (LLRs), each of the plurality of LLRs representing one of a plurality of bits of an LDPC codeword encoded using a parity check matrix having a plurality of layers, the decoder comprising circuitry for decoding the LLRs utilizing an attenuation factor matrix and a normalized layered min-sum decoding process to provide an estimate of the LDPC encoded codeword, the attenuation factor matrix including coefficients identifying attenuation factors for two or more of the layers of the parity check matrix.

14. The LDPC decoder of claim 13, wherein the attenuation factor matrix includes a coefficient for each of the layers of the parity check matrix.

15. The LDPC decoder of claim 13, wherein the layers of the parity check matrix include a first layer and a second layer, the coefficient for the first layer different from the coefficient for the second layer.

16. The LDPC decoder of claim 15, wherein the decoding may be performed over multiple iterations and wherein the attenuation factor matrix includes coefficients for a first iteration and a second iteration, at least some of the coefficients for the first iteration different from the coefficients for the second iteration.

17. The LDPC decoder of claim 15 wherein the attenuation factor matrix includes coefficients for each iteration of the decoding process.

18. The LDPC decoder of claim 15 wherein the attenuation factor matrix includes a coefficient for each layer of the parity check matrix and each iteration of the decoding process.

19. The LDPC decoder of claim 13, wherein the circuitry for decoding the LLRs further comprises:
 a check node processor having circuitry for performing check node processing for each layer of the parity check matrix associated with the LDPC encoded codeword utilizing a normalized layered min-sum algorithm having at least one layer specific attenuation factor associated with at least one layer of the parity check matrix;
 a variable node processor coupled to the check node processor, the variable node processor having circuitry for performing variable node processing for each layer of the parity check matrix; and
 a codeword estimate check processor coupled to the variable node processor, the codeword estimate check processor having circuitry for performing a check of the estimate of the LDPC encoded codeword to determine if the codeword estimate is a codeword.

20. The LDPC decoder of claim 19, wherein the decoder further comprises circuitry for outputting the codeword estimate from the decoder if the codeword estimate is a codeword and for initiating another iteration of the decoding process beginning with performing check node processing if the codeword estimate is not a codeword.

* * * * *